(12) United States Patent
Yoshimochi

(10) Patent No.: US 7,091,555 B2
(45) Date of Patent: Aug. 15, 2006

(54) SEMICONDUCTOR DEVICE FOR SWITCHING

(75) Inventor: Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 72 days.

(21) Appl. No.: 10/813,236

(22) Filed: Mar. 31, 2004

(65) Prior Publication Data

US 2004/0222459 A1    Nov. 11, 2004

(30) Foreign Application Priority Data

Apr. 2, 2003    (JP) .............................. 2003-099576

(51) Int. Cl.
  *H01L 29/76* (2006.01)
(52) U.S. Cl. ..................................... 257/330; 257/331
(58) Field of Classification Search ......... 257/328–334
  See application file for complete search history.

(56) References Cited

U.S. PATENT DOCUMENTS

| | | |
|---|---|---|
| 5,682,048 A | 10/1997 | Shinohara et al. |
| 5,723,376 A | 3/1998 | Takeuchi et al. |
| 5,747,851 A | 5/1998 | Tomatsu et al. |
| 5,776,812 A | 7/1998 | Takahashi et al. |
| 5,895,939 A | 4/1999 | Ueno |
| 5,915,180 A | 6/1999 | Hara et al. |
| 5,952,679 A | 9/1999 | Kitou et al. |
| 5,963,807 A | 10/1999 | Ueno |
| 5,976,936 A | 11/1999 | Miyajima et al. |
| 6,020,600 A | 2/2000 | Miyajima et al. |
| 6,133,587 A | 10/2000 | Takeuchi et al. |
| 6,238,981 B1 | 5/2001 | Grebs |
| 6,316,300 B1 | 11/2001 | Ozeki et al. |
| 6,475,864 B1 | 11/2002 | Sato et al. |
| 6,495,883 B1 | 12/2002 | Shibata et al. |
| 6,649,973 B1 | 11/2003 | Takaishi |
| 2002/0104988 A1 * | 8/2002 | Shibata et al. ................ 257/11 |

FOREIGN PATENT DOCUMENTS

| | | |
|---|---|---|
| JP | 7-326755 | 12/1995 |
| JP | 8-70124 | 3/1996 |
| JP | 8-236766 | 9/1996 |
| JP | 9-74191 | 3/1997 |
| JP | 9-153613 | 6/1997 |
| JP | 9-199724 | 7/1997 |
| JP | 9-213951 | 8/1997 |
| JP | 10-56174 | 2/1998 |
| JP | 10-125904 | 5/1998 |
| JP | 10-125905 | 5/1998 |
| JP | 10-154809 | 6/1998 |
| JP | 10-154810 | 6/1998 |

(Continued)

*Primary Examiner*—Hung Vu
(74) *Attorney, Agent, or Firm*—Rabin & Berdo, PC

(57) ABSTRACT

A semiconductor device provided with: a channel region of a first conductivity provided in a surface of a semiconductor substrate; a source region of a second conductivity different from the first conductivity, the source region being provided on an edge of a trench which extends through the channel region; a gate oxide film provided on an interior wall of the trench; and a gate electrode provided in the trench in opposed relation to the channel region with the intervention of the gate oxide film. The interior wall of the trench includes a first interior side surface having a (100) plane orientation, and a second interior side surface having a plane orientation different from the plane orientation of the first interior side surface, and the source region is disposed away from a portion of the gate oxide film provided on the second interior side surface.

5 Claims, 4 Drawing Sheets

FOREIGN PATENT DOCUMENTS

| | | |
|---|---|---|
| JP | 10-326895 | 12/1998 |
| JP | 2000-106435 | 4/2000 |
| JP | 2000-156376 | 6/2000 |
| JP | 2000-299457 | 10/2000 |
| JP | 2000-332246 | 11/2000 |
| JP | 2000-357795 | 12/2000 |
| JP | 3158973 | 2/2001 |
| JP | 2001-102576 | 4/2001 |
| JP | 2001-119023 | 4/2001 |
| JP | 2001-127289 | 5/2001 |
| JP | 2001-284587 | 10/2001 |
| JP | 2002-83962 | 3/2002 |
| JP | 2002-158233 | 5/2002 |
| JP | 3303601 | 5/2002 |
| JP | 2002-203963 | 7/2002 |
| JP | 2002-231948 | 8/2002 |
| JP | 2002-261041 | 9/2002 |
| JP | 2002-289853 | 10/2002 |

* cited by examiner

SEMICONDUCTOR DEVICE FOR SWITCHING

BACKGROUND OF THE INVENTION

1. Field of the Invention

The present invention relates to a semiconductor device such as a MOS FET and, particularly, to a semiconductor device for switching.

2. Description of Related Art

MOS FETs (metal oxide semiconductor field effect transistors) include a so-called trench-type MOS FET, which has a trench formed in a surface of a silicon substrate thereof. The MOS FET includes a plurality of cells each having a source region, a drain region, a channel region provided between the source region and the drain region, and a gate electrode. In each of the cells of the trench-type MOS FET, the source and drain regions and the gate electrode are disposed so that a channel is formed alongside an interior side surface of the trench.

This allows for microminiaturization of the cells (devices), so that the number of cells per unit area can be increased by densely arranging the microminiaturized cells. Thus, a channel formation area per unit area is increased, so that the ON-resistance is reduced.

FIG. 4 is a schematic sectional view of a conventional MOS FET 51 in production. An N⁻-type epitaxial layer 52 is provided in a surface of a silicon substrate. A P⁻-region 53 is provided on the epitaxial layer 52. A trench 54 is provided as extending through the P⁻-region 53 to the middle of the thickness of the epitaxial layer 52. N⁺-type source regions 55 are respectively provided on edges of the trench 54. A gate oxide film 57 of silicon oxide is provided on an interior wall of the trench 54.

A gate electrode 56 of polysilicon imparted with electrical conductivity by implantation of an impurity is provided in the trench 54. An electrode not shown is provided on the silicon substrate. When a predetermined voltage is applied between the electrode and the source regions 55 and the gate electrode 56 is kept at a predetermined potential, an electric current (drain current) flows between the source regions 55 and the epitaxial layer 52. The drain current flows alongside the gate oxide film 57 through portions of the P⁻-region 53 adjacent to the gate oxide film 57.

The surface of the silicon substrate has a (100) plane orientation. Therefore, the surface of the epitaxial layer 52 (parallel to the surface of the silicon substrate) also has a (100) plane orientation. The P⁻-regions 53 and the source regions 55 are each formed by implanting an impurity into the surface of the N⁻-type epitaxial layer 52 and, hence, have the same crystallographic orientation as the silicon substrate and the epitaxial layer 52.

Interior side surfaces 54s of the trench 54 each have a (100) plane orientation. Therefore, the drain current flows along planes each having a (100) plane orientation (hereinafter referred to as "(100) planes") in the P⁻-regions 53. Thus, the field effect efficiently occurs in the silicon surface to form channels, so that the ON-resistance is reduced.

MOS FETs having such a construction are disclosed in Japanese Unexamined Patent Publications No. 10-154809 (1998) and No. 10-154810 (1998).

With a recent trend toward thickness reduction of the gate oxide film 57, however, the capacitance of the gate oxide film 57 (hereinafter referred to as "gate capacitance Qg") tends to be increased. This deteriorates the switching characteristic of the MOS FET 51, thereby increasing power consumption.

If the thickness of the gate oxide film 57 is increased, it is possible to reduce the gate capacitance Qg to improve the switching characteristic of the MOS FET 51. However, the width of an inversion layer (channel) formed when the gate electrode 56 is kept at a predetermined potential is reduced, as the thickness of the gate oxide film 57 is increased (in the extreme case, no inversion layer is formed). Therefore, the increase of the thickness of the gate oxide film 57 increases the ON-resistance. That is, it is impossible to simultaneously achieve the reduction of the ON-resistance and the improvement of the switching characteristic in the conventional MOS FET 51.

The ON-resistance can be reduced by reducing the thickness of portions of the gate oxide film 57 adjoining the P⁻-regions 53. Therefore, the reduction of the ON-resistance and the improvement of the switching characteristic may simultaneously be achieved by reducing the thickness of the portions of the gate oxide film 57 adjoining the P⁻-regions 53, and increasing the thickness of the other portion of the gate oxide film 57. However, such a structure cannot be realized for the following reason.

Since the trench 54 is formed perpendicularly to the silicon substrate, a bottom surface 54b of the trench 54 mainly has a (100) plane orientation like the interior side surface 54s. The formation of the gate oxide film 57 is typically achieved by thermally oxidizing the interior wall of the trench 54, so that the interior surfaces having the same plane orientation are oxidized to the same thickness. Therefore, the portions of the gate oxide film 57 on the interior side surfaces 54s and a portion of the gate oxide film 57 on the bottom surface 54b have substantially the same thickness, which is equal to a thickness $d_{(100)}$ resulting from the thermal oxidation of the (100) plane of the crystalline silicon. Therefore, the capacitance $C_{GS}$ per unit area of the portions of the gate oxide film 57 on the interior side surfaces 54s is virtually equal to the capacitance $C_{GD}$ per unit area of the portion of the gate oxide film 57 on the bottom surface 54b.

Therefore, the increase of the thickness of the gate oxide film 57 reduces the gate capacitance Qg to improve the switching characteristic, but increases the ON-resistance. Conversely, the reduction of the thickness of the gate oxide film 57 reduces the ON-resistance, but increases the gate capacitance Qg to deteriorate the switching characteristic.

It is also conceivable to allow the gate oxide film 57 to have different thicknesses on the interior side surfaces 54s and on the bottom surface 54b by allowing the bottom surface 54b to have a plane orientation different from the plane orientation of the interior side surfaces 54s. More specifically, it is possible to achieve the aforesaid thickness relation of the gate oxide film 57 by allowing the interior side surfaces 54s to have a (100) plane orientation and allowing the bottom surface 54b to have a specific plane orientation different from the (100) plane orientation.

However, the trench 54 has not only the interior side surfaces 54s (hereinafter referred to as "first interior side surfaces") shown in FIG. 4 but also interior side surfaces (hereinafter referred to as "second interior side surfaces") which are oriented differently from the first interior side surfaces 54s (e.g., perpendicularly to the first interior side surfaces 54s). If the bottom surface 54b has a plane orientation different from the (100) plane orientation, the second interior side surfaces also have the plane orientation different from the (100) plane orientation. Since the source regions 55 are provided along all the edges of the trench 54, channels are formed in portions of the P⁻-regions 53 alongside the second interior side surfaces.

Where the gate oxide film 57 is formed under the same conditions, a charge density (interfacial charge density) $Q_{ss}$ per unit area in an interface between the gate oxide film 57 and the surface having the plane orientation different from the (100) plane orientation tends to be greater than an interfacial charge density $Q_{ss}$ in an interface between the gate oxide film 57 and the surface having the (100) plane orientation. If the channel was formed alongside the surface having a greater interfacial charge density $Q_{ss}$ in the channel region, the operation reliability of the semiconductor device would be deteriorated due to greater fluctuations in gate threshold voltage.

SUMMARY OF THE INVENTION

It is an object of the present invention to provide a semiconductor device which has an improved switching characteristic.

It is another object of the present invention to provide a semiconductor device which has a reduced ON-resistance.

It is still another object of the present invention to provide a semiconductor device which has a higher reliability.

The semiconductor device according to the present invention comprises: a channel region of a first conductivity provided in a surface of a semiconductor substrate; a source region of a second conductivity different from the first conductivity, the source region being provided on an edge of a trench which extends through the channel region; a gate oxide film provided on an interior wall of the trench; and a gate electrode provided in the trench in opposed relation to the channel region with the intervention of the gate oxide film. The interior wall of the trench includes a first interior side surface having a (100) plane orientation, and a second interior side surface having a plane orientation different from the plane orientation of the first interior side surface, and the source region is disposed away from a portion of the gate oxide film provided on the second interior side surface.

According to the present invention, a predetermined voltage is applied between the source region and the semiconductor substrate across the channel region, and the gate electrode is kept at a predetermined potential, whereby an electric current (drain current) flows through a portion of the channel region adjacent to the gate oxide film.

The source region is disposed away from the portion of the gate oxide film provided on the second interior side surface having the plane orientation different from the (100) plane orientation, so that the channel formation alongside the surface having a greater interfacial charge density $Q_{ss}$ can be avoided. Thus, the semiconductor device has a higher reliability.

The interior wall of the trench may further include a bottom surface having a major plane orientation with a higher areal atom density than the first interior side surface. In this case, the first interior side surface of the trench interior wall has the (100) plane orientation, and the bottom surface of the trench interior wall has the major plane orientation with a higher areal atom density than the surface having the (100) plane orientation. Where formation of the gate oxide film is achieved by thermal oxidation of the trench interior wall, the thickness of the gate oxide film is increased as the areal atom density of the surface is increased. Therefore, a portion of the gate oxide film on the bottom surface has a greater thickness than a portion of the gate oxide film on the first interior side surface. Thus, the capacitance of the portion of the gate oxide film on the bottom surface of the trench is reduced, whereby the overall gate capacitance Qg is reduced.

Even if the thickness of the portion of the gate oxide film on the bottom surface is increased, the portion of the gate oxide film on the first interior side surface can have a reduced thickness. Thus, a broader inversion layer (channel) can be formed in a portion of the channel region opposed to the gate electrode with the intervention of the gate oxide film portion on the first interior side surface. Therefore, the reduction of the ON-resistance and the improvement of the switching characteristic of the semiconductor device can simultaneously be achieved.

The semiconductor substrate may have an epitaxial layer provided in the surface thereof. The channel region and the source region may each be formed by introducing an impurity into the epitaxial layer. The epitaxial layer has the same crystallographic orientation as the semiconductor substrate, and the crystallographic orientation is not changed by the introduction of the impurity. The semiconductor substrate may be composed, for example, of silicon.

The surface of the semiconductor substrate may have a plane orientation with a greater areal atom density than the surface having the (100) plane orientation.

The major plane orientation of the bottom surface of the trench provided perpendicularly to the semiconductor substrate is substantially the same as the plane orientation of the surface of the semiconductor substrate. With the aforesaid arrangement, the bottom surface of the trench provided perpendicularly to the semiconductor substrate has a higher areal atom density than the surface having the (100) plane orientation and, hence, can be oxidized to a greater thickness than the first interior side surface.

The surface of the semiconductor substrate may have, for example, a (110) plane orientation. In this case, the bottom surface of the trench provided perpendicularly to the semiconductor substrate also mainly has a (110) plane orientation.

In crystalline silicon, a (100) plane has an areal atom density of $6.8 \times 10^{14}$ atoms (silicon atoms)/cm$^2$, and a (110) plane has an areal atom density of $9.6 \times 10^{14}$ atoms/cm$^2$. Therefore, the gate oxide film can be formed as having a smaller thickness on the first interior side surface and having a greater thickness on the bottom surface by the thermal oxidation of the interior wall of the trench.

The trench may include a plurality of trench portions extending parallel to each other along the first interior side surface in the surface of the semiconductor substrate. In this case, the semiconductor device further comprises a lower resistance region of the first conductivity extending longitudinally of the trench portions and intervening between the second interior side surface and the source region, the lower resistance region being imparted with a lower resistance by introduction of an impurity.

With this arrangement, where a counter electromotive force is applied to the semiconductor device in a circuit, an electric current flows through the lower resistance region but not through a channel formation area in the channel region. Thus, the semiconductor device has a higher breakdown resistance against the counter electromotive force.

Where the lower resistance region of the first conductivity is disposed alongside the second interior side surface, the channel formation alongside the second interior side surface in the channel region can assuredly be prevented.

The first interior side surface has a greater length as measured along the surface of the semiconductor substrate than the second interior side surface.

With this arrangement, the source region is elongated along the first interior side surface in the surface of the semiconductor substrate. Therefore, the channel formation area in the channel region can be broadened, so that the semiconductor device has a reduced ON-resistance.

The foregoing and other objects, features and effects of the present invention will become more apparent from the following description of the preferred embodiment with reference to the attached drawings.

DESCRIPTION OF THE PREFERRED EMBODIMENTS

Figure 1:
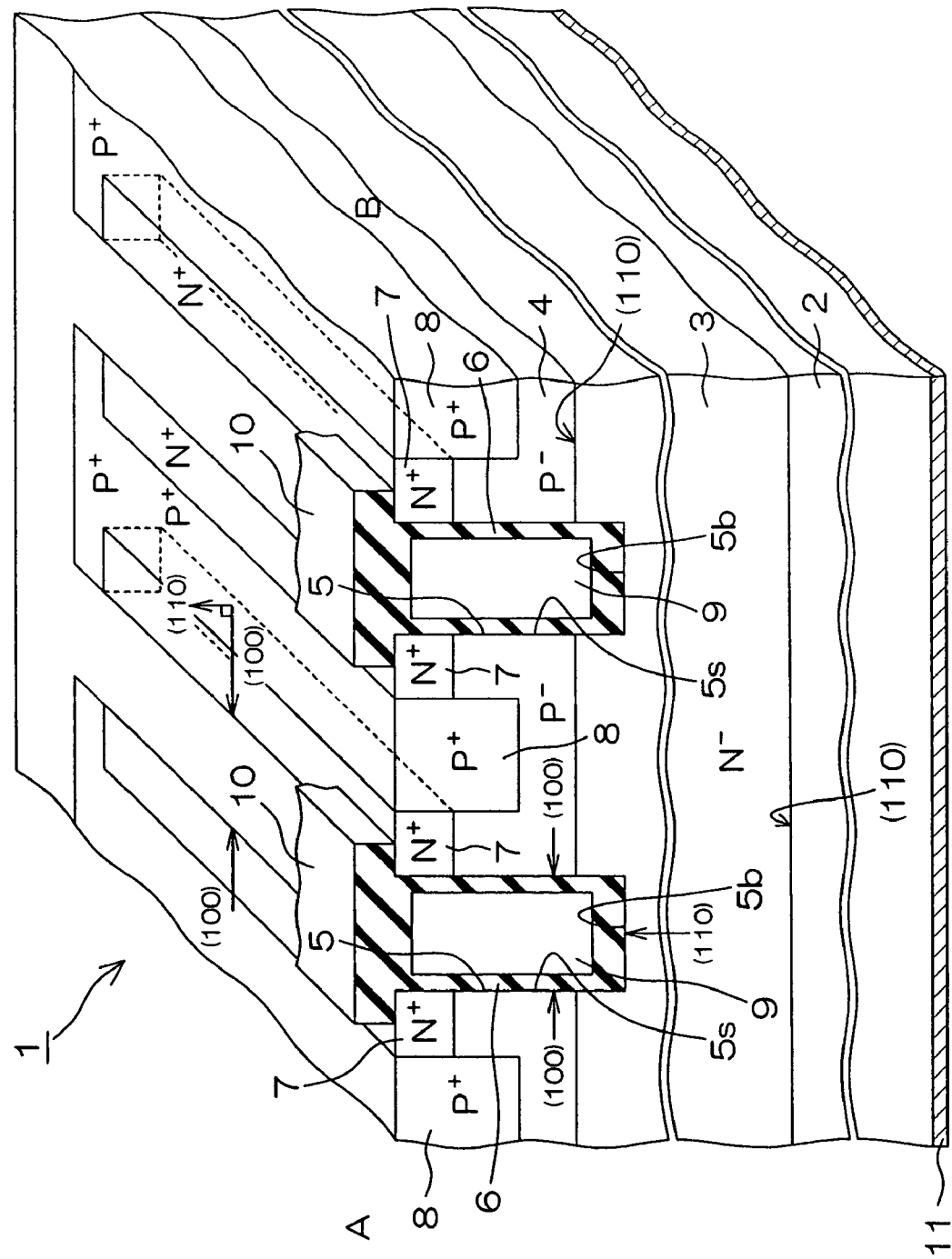
FIG. 1 is a schematic perspective view illustrating a MOS FET partly in section according to one embodiment of the present invention.

FIG. 1 is a schematic perspective view illustrating a MOS FET 1 partly in section according to one embodiment of the present invention.

An N⁻-type epitaxial layer 3 (drain region) is provided in a surface of the silicon substrate 2. P⁻-regions 4 (channel regions) are provided on the epitaxial layer 3.

A trench 5 is provided as extending through the P⁻-regions 4 to the middle of the thickness of the epitaxial layer 3. The trench 5 is generally perpendicular to the silicon substrate 2. The trench 5 extends along the surface of the silicon substrate 2 (perpendicularly to a section of the MOS FET 1 shown in FIG. 1). The trench 5 includes a plurality of trench portions, which are arranged generally parallel to each other in juxtaposition.

A gate oxide film 6 of silicon oxide is provided on an interior wall of the trench 5. N⁺-type source regions 7 are respectively provided on edges of the trench portions of the trench 5. A P⁺-region 8 is provided between the source region 7 provided on the edge of one of two adjacent trench portions of the trench 5 and the source region 7 provided on the edge of the other trench portion as extending longitudinally of the trench portions. The P⁺-region 8 contains an impurity introduced therein at a high concentration and, hence, has a higher conductivity (lower resistance) than the P⁻-region 4.

A gate electrode 9 of polysilicon imparted with electrical conductivity by introduction of an impurity is provided in the trench 5. Therefore, the gate electrode 9 extends in the same direction as the trench 5.

An insulative layer 10 of silicon oxide is provided on the gate electrode 9. The insulative layer 10 entirely covers the gate electrode 9, but is illustrated as partly covering the gate electrode 9 in FIG. 1. A metal film not shown is provided as a source region lead electrode on the source regions 7, the P⁺-regions 8 and the insulative layer 10.

An electrode 11 is provided on the silicon substrate 2. A predetermined voltage is applied between the electrode 11 and the metal film, and the gate electrode 9 is kept at a predetermined potential, whereby an electric current (drain current) flows between the source regions 7 and the epitaxial layer 3. The drain current flows alongside the gate oxide film 6 through portions of the P⁻-regions 4 adjacent to the gate oxide film 6. That is, channels are formed in the portions of the P⁻-regions 4 adjacent to the gate oxide film 6.

If a counter electromotive force is applied to the MOS FET 1 in a circuit, an electric current flows through the P⁺-regions 8 having a lower resistance but not through channel formation areas in the P⁻-regions 4. Thus, the MOS FET 1 has an increased breakdown resistance against the counter electromotive force.

Figure 2:
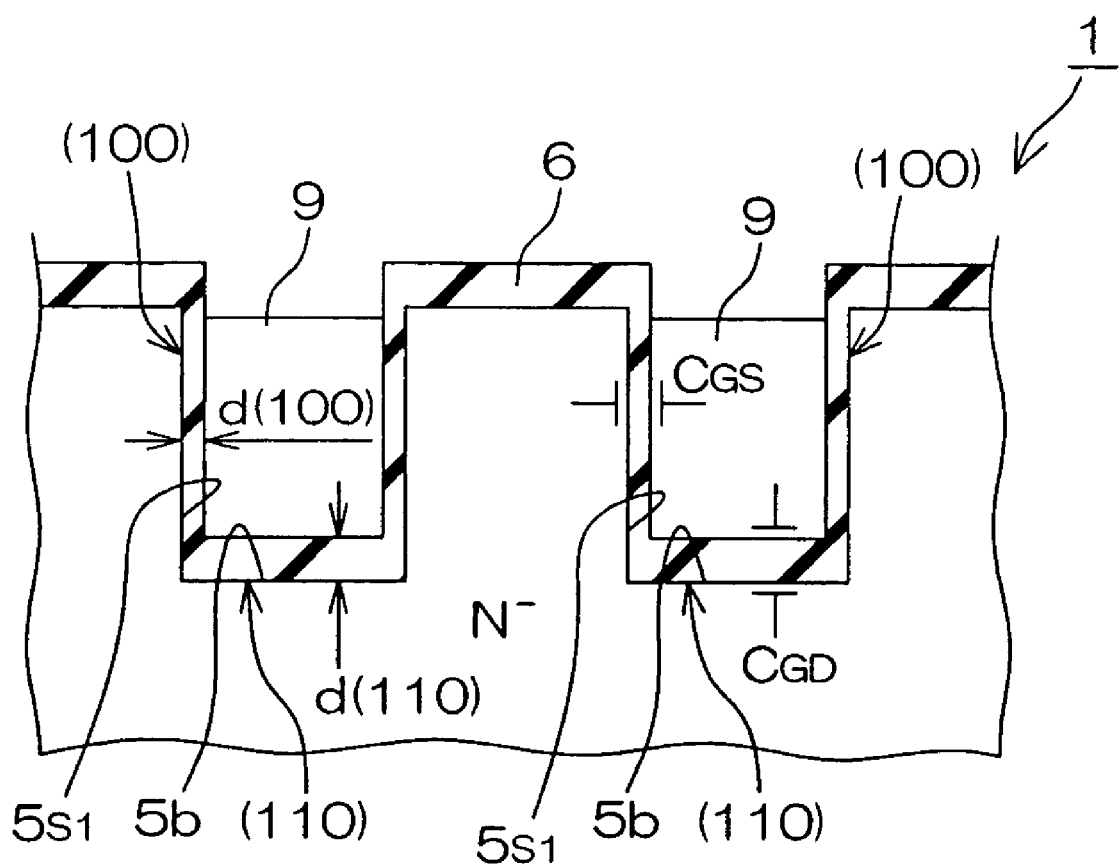
FIG. 2 is a vertical sectional view of a trench of the MOS FET in production.

FIG. 2 is a vertical sectional view of the trench 5 of the MOS FET 1 in production.

Referring to FIGS. 1 and 2, the surface of the silicon substrate 2 has a (110) plane orientation. Therefore, the surface of the epitaxial layer 3 (parallel to the surface of the silicon substrate 2) also has a (110) plane orientation. The P⁻-regions 4, the source regions 7 and the P⁺-regions 8 are each formed by introducing (e.g., implanting) the impurity into the N⁻-type epitaxial layer 3 and, hence have the same crystallographic orientation as the silicon substrate 2 and the epitaxial layer 3.

Interior side surfaces of the interior side wall 5s of the trench 5 extending longitudinally of the trench portions of the trench 5 (hereinafter referred to as "first interior side surfaces $5s_1$") each have a (100) plane orientation. Therefore, the drain current flows through portions of the P⁻-regions 4 adjacent to the first interior side surfaces $5s_1$ along a plane having the (100) plane orientation (hereinafter referred to as "(100) plane").

In general, the carrier mobility in crystalline silicon is greater along the (100) plane than along a plane having any other plane orientation. Further, an interfacial charge density $Q_{ss}$ in the (100) plane is smaller than an interfacial charge density $Q_{ss}$ in the plane having any other plane orientation. Thus, the field effect efficiently occurs in the silicon surface (in the interfaces between the gate oxide film 6 and the P⁻-regions 4) to form the channels, so that the portions of the P⁻-regions 4 adjacent to the first interior side surfaces $5s_1$ have a lower ON-resistance.

Further, a bottom surface 5b of the trench 5 is generally perpendicular to the first interior side surfaces $5s_1$ (or is parallel to the surface of the silicon substrate 2). Therefore, the bottom surface 5b essentially has a (110) plane orientation.

Next, the capacitance of a portion of the gate oxide film 6 on the first interior side surface $5s_1$ will be compared with a portion of the gate oxide film 6 on the bottom surface 5b. In general, a capacitance C observed when a pair of electrodes are opposed to each other with the intervention of a dielectric (insulator) is expressed as εS/d, wherein ε is the dielectric constant of the dielectric, S is the area of a portion of the dielectric opposed to the electrodes, and d is the thickness of the dielectric disposed between the electrodes.

Since the gate oxide film 6 is composed of silicon oxide, its dielectric constant is virtually unchanged. Therefore, the capacitance $C_{GS}$ per unit area of the portion of the gate oxide film 6 on the first interior side surface $5s_1$ and the capacitance $C_{GD}$ per unit area of the portion of the gate oxide film 6 on the bottom surface 5b depend on the thickness of the gate oxide film 6.

The gate oxide film 6 is formed by thermally oxidizing the interior wall of the trench 5. The thickness of an oxide film formed by thermally oxidizing crystalline silicon is increased, as the areal silicon atom density in a crystal plane is increased. The areal silicon atom density in the crystal plane varies depending on the crystallographic orientation. For example, the (100) plane has an areal atom density of $6.8 \times 10^{14}$ atoms/cm², and a plane having a (110) plane orientation (hereinafter referred to as "(110) plane") has an areal atom density of $9.6 \times 10^{14}$ atoms/cm$^2$. Further, a plane having a (111) plane orientation has an areal atom density of $11.8 \times 10^{14}$ atoms/cm$^2$.

Figure 4:
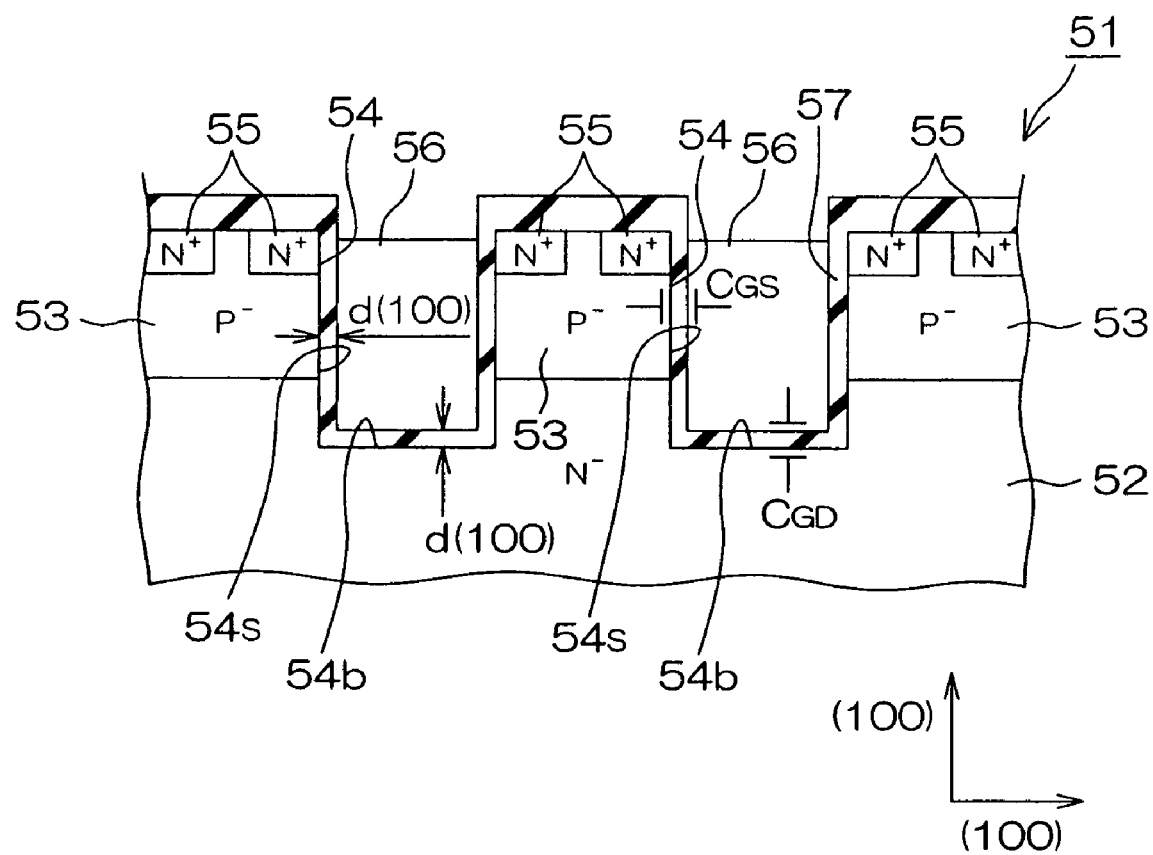
FIG. 4 is a schematic sectional view illustrating a conventional MOS FET in production.

Therefore, the thickness $d_{(100)}$ of the portion of the gate oxide film 6 on the first interior side surface 5$s_1$ is smaller than the thickness $d_{(110)}$ of the portion of the gate oxide film 6 on the bottom surface 5$b$ ($d_{(100)} < d_{(110)}$). Accordingly, the capacitance $C_{GD}$ per unit area of the portion of the gate oxide film 6 on the bottom surface 5$b$ is smaller than the capacitance $C_{GS}$ per unit area of the portion of the gate oxide film 6 on the first interior side surface 5$s_1$ ($C_{GS} > C_{GD}$). Therefore, the gate capacitance Qg of the MOS FET 1 can totally be reduced as compared with the conventional MOS FET in which the thickness of the gate oxide film 57 is wholly reduced (see FIG. 4). Thus, the MOS FET 1 has an improved switching characteristic.

Further, broader (thicker) inversion layers (channels) can be formed in the portions of the P$^-$-regions 4 opposed to the gate electrode 9 with the intervention of the gate oxide films 6 by reducing the thickness $d_{(100)}$ of the portions of the gate oxide film 6 on the first interior side surfaces 5$s_1$. Thus, the ON-resistance can be reduced.

Figure 3:
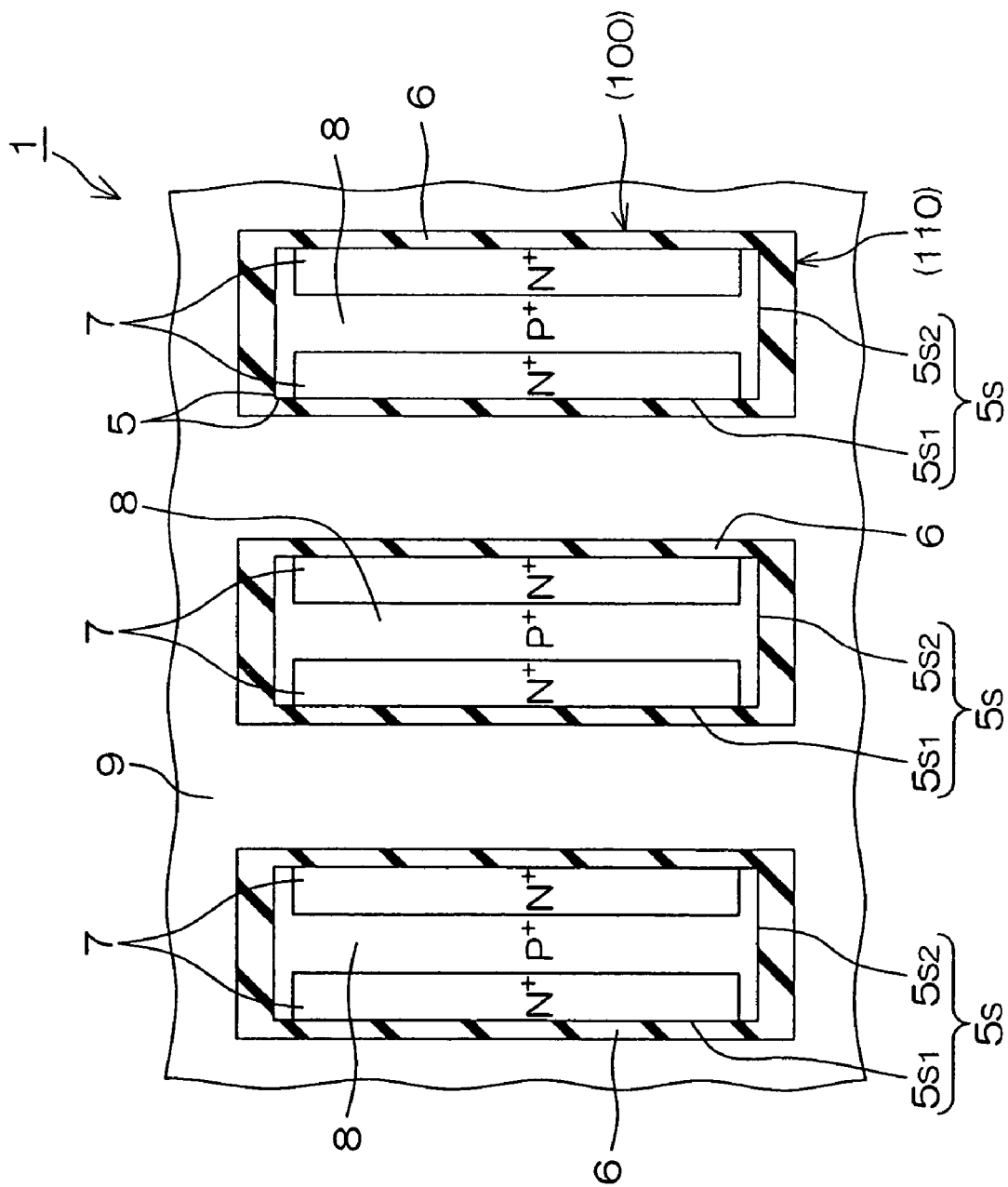
FIG. 3 is a schematic plan view of the MOS FET of FIG. 1 as seen from the side of the trench.

FIG. 3 is a schematic plan view of the MOS FET 1 of FIG. 1 as seen from the side of the trench 5. In FIG. 3, the insulative layer 10 is not shown.

The interior side wall 5$s$ of the trench 5 also includes second interior side surfaces 5$s_2$ generally perpendicular to the first interior side surfaces 5$s_1$. Since the bottom surface 5$b$ of the trench (the surface of the silicon substrate 2) has the (110) plane and the first interior side surfaces 5$s_1$ each have the (100) plane, the second interior side surfaces 5$s_2$ each have a (110) plane. Therefore, portions of the gate oxide film 6 on the second interior side surfaces 5$s_2$, like the portion of the gate oxide film 6 on the bottom surface 5$b$, each have a greater thickness than the portions of the gate oxide film on the first interior side surfaces 5$s_1$.

The source regions 7 are provided only on the edges of the first interior side surfaces 5$s_1$ out of the edges of the trench 5. That is, the source regions 7 are disposed away from the portions of the gate oxide film 6 provided on the second interior side surfaces 5$s_2$. The P$^+$-regions 8 are each opposed to the gate electrode 9 with the intervention of the portions of the gate oxide film 6 on the second interior side surface 5$s_2$ (or are present between the gate electrode 9 and the source regions 7).

If the channels were formed alongside the surfaces having a greater interfacial charge density $Q_{ss}$ in the P$^-$-regions 4, the operation reliability of the MOS FET 1 would be deteriorated due to greater fluctuations in gate threshold voltage. However, the source regions 7 are not provided along the second interior side surfaces 5$s_2$ each having the (110) plane, so that the channel formation along the (110) planes in the P$^-$-regions 4 is avoided. Thus, the MOS FET 1 has higher reliability.

Further, the P$^+$-regions 8 partly intervene between the second interior side surfaces 5$s_2$ and the source regions 7, thereby assuredly preventing the channel formation alongside the second interior side surfaces 5$s_2$ in the P$^-$-regions 4.

The first interior side surfaces 5$s_1$ each have a greater length as measured along the surface of the silicon substrate 2 than the second interior side surfaces 5$s_2$. Since the source regions 7 are each elongated along the first interior side surfaces 5$s_1$ in the surface of the silicon substrate 2, the area of the source regions 7 per unit area of the silicon substrate 2 is increased. Therefore, the channel formation areas in the P$^-$-regions 4 are broadened, so that the MOS FET 1 has a reduced ON-resistance.

While the embodiment of the present invention has thus been described, the present invention may be embodied in any other way. The inventive semiconductor device is embodied as the N-channel transistor by way of example according to the embodiment described above, but may be embodied as a P-channel transistor. Besides the MOS FET, the inventive semiconductor device may be embodied as an IGBT (insulated gate bipolar transistor) or a like semiconductor device.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2003-099576 filed with the Japanese Patent Office on Apr. 2, 2003, the disclosure thereof being incorporated herein by reference.

What is claimed is:

1. A semiconductor device, comprising:
   a channel region of a first conductivity provided in a surface of a semiconductor substrate;
   a source region of a second conductivity different from the first conductivity, the source region being provided on an edge of a trench which extends through the channel region;
   a gate oxide film provided on an interior wall of the trench; and
   a gate electrode provided in the trench in opposed relation to the channel region with the intervention of the gate oxide film;
   wherein the interior wall of the trench includes a first interior side surface having a (100) plane orientation, and a second interior side surface having a plane orientation different from the plane orientation of the first interior side surface;
   wherein the source region is disposed away from a portion of the gate oxide film provided on the second interior side surface; and
   wherein the trench includes a plurality of trench portions extending parallel to each other along the first interior side surface in the surface of the semiconductor substrate; and
   a lower resistance region of the first conductivity extending longitudinally of the trench portions and intervening between the second interior side surface and the source region, the lower resistance region being imparted with a lower resistance by introduction of an impurity.

2. The semiconductor device as set forth in claim 1, wherein the interior wall of the trench further include a bottom surface having a major plane orientation with a higher areal atom density than the first interior side surface.

3. The semiconductor device as set forth in claim 2, wherein the surface of the semiconductor substrate has a plane orientation with a greater areal atom density than the surface having the (100) plane orientation.

4. The semiconductor device as set forth in claim 2, wherein the surface of the semiconductor substrate has a (110) plane orientation.

5. The semiconductor device as set forth in claim 1, wherein the first interior side surface has a greater length as measured along the surface of the semiconductor substrate than the second interior side surface.

* * * * *